United States Patent
Lin

(10) Patent No.: US 11,217,770 B2
(45) Date of Patent: Jan. 4, 2022

(54) DISPLAY PANEL AND MANUFACTURING METHOD THEREOF

(71) Applicant: Shenzhen China Star Optoelectronics Semiconductor Display Technology Co., Ltd., Guangdong (CN)

(72) Inventor: Bifen Lin, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/621,242

(22) PCT Filed: Aug. 12, 2019

(86) PCT No.: PCT/CN2019/100138
§ 371 (c)(1),
(2) Date: Dec. 11, 2019

(87) PCT Pub. No.: WO2020/237834
PCT Pub. Date: Dec. 3, 2020

(65) Prior Publication Data
US 2020/0373516 A1    Nov. 26, 2020

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01)

(58) Field of Classification Search
CPC . H01L 51/5262; H01L 51/5275; H01L 51/56; H01L 27/3258
See application file for complete search history.

(56) References Cited

U.S. PATENT DOCUMENTS

| | | | |
|---|---|---|---|
| 2014/0021492 A1* | 1/2014 | Wolk | H01L 51/5275 257/88 |
| 2016/0141452 A1 | 5/2016 | Chen | |
| 2016/0351854 A1* | 12/2016 | Cho | H01L 51/006 |
| 2016/0365392 A1* | 12/2016 | Li | H01L 27/3232 |

FOREIGN PATENT DOCUMENTS

| | | |
|---|---|---|
| CN | 104201188 A | 12/2014 |
| CN | 104409646 A | 3/2015 |
| KR | 20120053318 A | 5/2012 |

* cited by examiner

*Primary Examiner* — Caridad Everhart
(74) *Attorney, Agent, or Firm* — Mark M. Friedman

(57) ABSTRACT

A display panel includes a thin-film transistor (TFT) array substrate, and a passivation layer and an organic planarization layer both disposed on the TFT array substrate. A silicon oxide (SiOx) layer, a silicon nitride (SiNx) layer, and an organic light-emitting diode (OLED) device layer are disposed on the organic planarization layer. The SiOx layer includes a plurality of first SiOx film portions disposed in a consecutive arrangement, and a plurality of second SiOx film portions disposed in a non-consecutive arrangement. The second SiOx film portions have a fuzz surface, and a photonic crystal structure is formed by corresponding portions of the SiNx layer disposed above the second SiOx film portions and the fuzz surface. The display panel of the present invention utilizes the photonic crystal structure disposed on a light-emitting area to effectively improve a light extraction rate of the OLED device.

9 Claims, 3 Drawing Sheets

DISPLAY PANEL AND MANUFACTURING METHOD THEREOF

BACKGROUND OF INVENTION

1. Field of Invention

The present invention relates to technical field of flat displays, and particularly to, a display panel and a manufacturing method thereof.

2. RELATED ART

With ever-changing flat display technology, organic light-emitting diode (OLED) display technology is increasingly recognized by the industry as a next-generation display technology replacing liquid crystal display technology.

Although OLED display technology has advantages of being self-luminous, wide viewing angles, ultra-high contrasts, low power consumption, quick response times, etc., it also has certain disadvantages. Therefore, there are still some technical problems to be solved to prove that OLED display technology can completely replace the liquid crystal display technology. For example, light extraction rate of OLED devices is one of the problems.

The light extraction rate of OLED devices refers to a rate that self-luminescence generated inside the OLED devices can be emitted to the outside. Apparently, if the OLED devices have a low light extraction rate, most amount of the self-luminescence of the OLED devices will be lost inside the devices and cannot be emitted outside the devices, which will undoubtedly greatly affect its efficiency.

Accordingly, the industries have brought about specific "light extraction" technology to specially develop technical solutions to improve OLED light extraction rate. One of the solutions brought about to improve the light extraction rate of OLED devices is to reduce waveguide effects of OLED devices. A corresponding method is implemented by reducing thickness of mediums, such as thickness of OLED organic layers or indium tin oxide (ITO), but this method cannot be fully implemented in practical applications.

In addition, there are still further research findings in the industries. The introduction of photonic crystals can release photons that are confined to waveguide effects of ITO/organic layers, but specific implementations are still under exploration.

Therefore, it is imperative to develop a novel display panel and a method of manufacturing the same to overcome defects in prior art.

SUMMARY OF INVENTION

The present invention provides a display panel configured with a photonic crystal structure in a light-emitting area to effectively improve a light extraction rate of a built-in organic light-emitting diode (OLED) device.

A display panel, comprising a thin-film transistor (TFT) array substrate; a passivation layer and an organic planarization layer both disposed on the TFT array substrate; wherein a silicon oxide (SiOx) layer, a silicon nitride (SiNx) layer, and an organic light-emitting diode (OLED) device layer are disposed on the organic planarization layer; wherein the SiOx layer comprises a plurality of first SiOx film portions disposed in a consecutive arrangement, and a plurality of second SiOx film portions disposed in a non-consecutive arrangement, wherein the second SiOx film portions have a fuzz surface, and a photonic crystal structure is formed by corresponding portions of the SiNx layer disposed above the second SiOx film portions and the fuzz surface.

Further, in a different embodiment, the second SiOx film portions are disposed corresponding to a light-emitting area of the OLED device layer.

Further, in a different embodiment, the first SiOx film portions have a thickness of 800 to 1200 angstroms.

Further, in a different embodiment, the SiNx layer has a thickness of 800 to 1200 angstroms.

The present invention further provides a method of manufacturing the display panel of claim 1, comprising step S1: providing a thin-film transistor (TFT) array substrate and forming the passivation layer and the organic planarization layer on the TFT array substrate; step S2: forming the silicon oxide (SiOx) layer on the organic planarization layer, and patterning, by a mask, the SiOx layer, to enable the SiOx layer to form the first SiOx film portions disposed in a consecutive arrangement and empty portions; step S3: bombarding, by using plasma, the first SiOx film portions so that part of a SiOx material in the first SiOx film portions is transferred to the empty portions to form the second SiOx film portions disposed in a non-consecutive arrangement, and etching the organic planarization layer, wherein the second SiOx film portions after being etched form the fuzz surface; step S4: forming the silicon nitride (SiNx) layer on the SiOx layer; and step S5: forming an organic light-emitting diode (OLED) device layer on the SiNx layer.

Further, in a different embodiment, in step S2, the empty portions formed after the SiOx layer is patterned are disposed corresponding to a light-emitting area of the OLED device layer.

Further, in a different embodiment, in step S3, in step S3, the plasma includes argon (Ar) plasma.

Further, in a different embodiment, in step S3, the second SiOx film portions disposed in the non-consecutive arrangement are used as a hard mask for etching of the organic planarization layer.

Further, in a different embodiment, in step S3, an oxygen (02) etching gas is used for etching of the organic planarization layer.

Further, in a different embodiment, in step S4, the silicon nitride (SiNx) layer is formed by a chemical vapor deposition (CVD) film formation process.

Further, in a different embodiment, in step S4, a mask used in forming the SiNx layer is also used in forming the passivation layer in step S1, thereby reducing number of masks used in manufacturing process of the present invention, enhancing a utilization rate of masks, and further reducing manufacturing costs in connection with the manufacturing method of the present invention to a certain degree.

Further, in a different embodiment, in step S5, the OLED device layer comprises a pixel definition layer (PDL), wherein a mask used in forming the pixel definition layer is the same as the mask used in patterning the SiOx layer in step S2. That is, the mask used in patterning the SiOx layer is also used in forming the pixel definition layer in the subsequent step, thereby reducing number of masks used in manufacturing process of the present invention, enhancing a utilization rate of masks, and further reducing manufacturing costs in connection with the manufacturing method of the present invention to a certain degree.

Further, in a different embodiment, in step S5, the OLED device layer comprises a light-emitting device fabricated by an evaporation process.

The present invention relates to a display panel and a method of manufacturing the same, wherein the display panel utilizes both the fuzz surface of the SiOx layer and a light-emitting area disposed above the SiNx layer and corresponding to the fuzz surface to form a photonic crystal structure, thereby to effectively improve a light extraction rate of the OLED device.

Furthermore, based on the manufacturing method of the present invention, the mask used in forming the fuzz surface of the SiOx layer is also used to form the pixel definition layer of the OLED device in the subsequent step, and thus no specific and special mask is additionally required, thereby reducing costs of manufacturing the display panel of the present invention to a certain degree.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The technical solutions of a display panel and a method of manufacturing the same according to the present invention will be further described in detail below with reference to the accompanying drawings and embodiments.

Since the present invention relates to a display panel and a method of manufacturing the same, in order to avoid unnecessary repetitive description, a structure of the display panel according to the present invention will be described in detail below by the manufacturing method.

A method of manufacturing a display panel of an embodiment of the present invention includes following steps.

Figure 1:
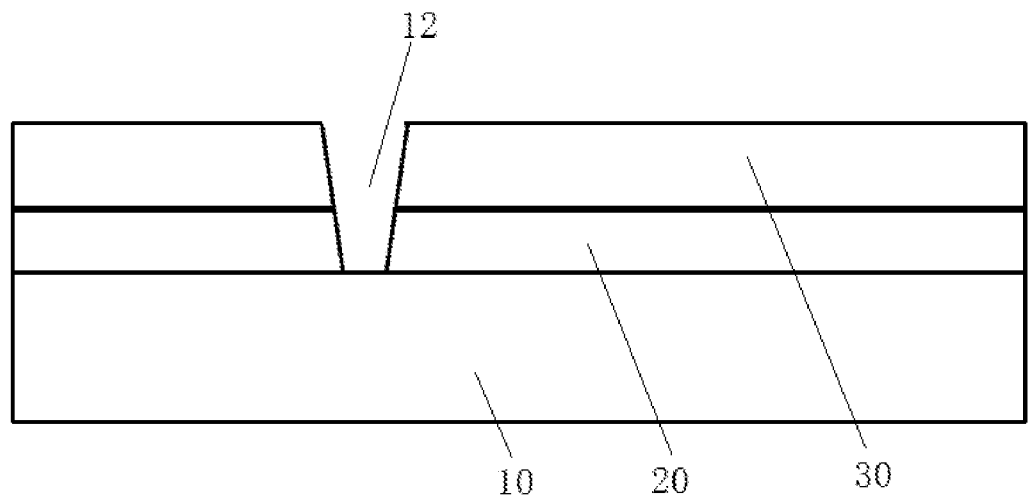
FIG. 1 is a schematic structural view showing a display panel manufactured by step S1 of a method of manufacturing the display panel of an embodiment of the present invention.

Step S1: providing a thin-film transistor (TFT) array substrate 10, and forming a passivation (PV) layer 20, an organic planarization layer 30, and a contact via-hole 12 for electrical connection with an anode on the TFT array substrate 10, wherein a corresponding structure after implementation of this step is shown as FIG. 1.

A TFT device provided on the TFT array substrate 10 may be specifically an amorphous silicon (a-si) type, an indium gallium zinc oxide (IGZO) type, a low temperature polysilicon (LTPS) type, etc., but is not limited thereto, and may be specifically determined as needed.

Figure 2:
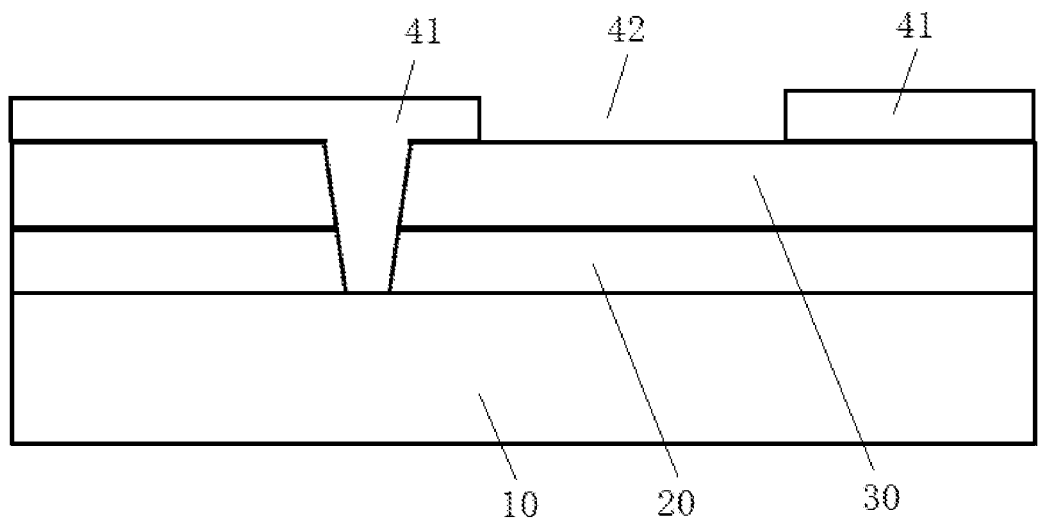
FIG. 2 is a schematic structural view showing a display panel manufactured by step S2 of the method of manufacturing the display panel of claim 1.

Step S2: forming a silicon oxide (SiOx) layer of about 1000 angstroms thickness on the organic planarization layer 30 through a chemical vapor deposition (CVD) film formation process, and then patterning the SiOx layer by a mask for subsequently fabrication of a pixel definition layer (PDL) of an organic light-emitting diode (OLED) device layer, so that the SiOx layer is enabled to form a first SiOx film portions 41 disposed in a consecutive arrangement and empty portions 42, wherein a corresponding structure after implementation of this step is shown as FIG. 2.

Figure 3:
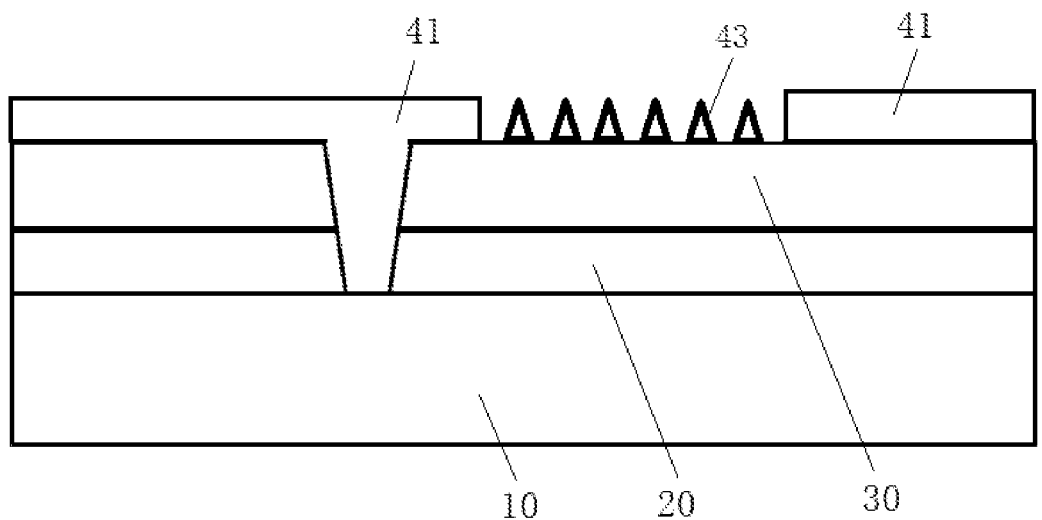
FIG. 3 is a schematic structural view showing a display panel manufactured by step S3 of the method of manufacturing the display panel of claim 1.

Step S3: bombarding the first SiOx film portions 41 by using argon (Ar) plasma so that part of a SiOx material in the first SiOx film portions 41 is transferred to the empty portions 42 to form the second SiOx film portions 43 disposed in a non-consecutive arrangement; then, etch the organic planarization layer 30 by using oxygen (02) etching gas with the second SiOx film portions 43 disposed in the non-consecutive arrangement as a hark mask, wherein the second SiOx film portions 43 after being etched form a fuzz surface. A corresponding structure after implementation of this step is shown as FIG. 3.

Figure 4:
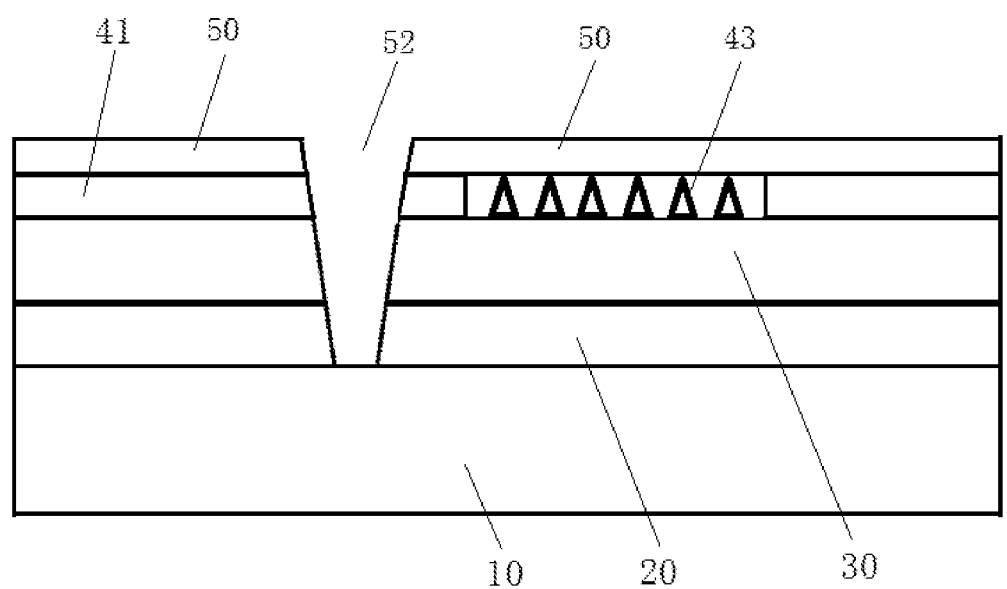
FIG. 4 is a schematic structural view showing a display panel manufactured by step S4 of the method of manufacturing the display panel of claim 1.

Step S4: forming a silicon nitride (SiNx) layer 50 on the SiOx layer. The SiNx layer is formed with a thickness of about 1000 angstroms through a CVD film formation process, and is patterned by a mask the same as the mask used in forming the passivation layer 20 in step S1. Furthermore, an anode contact hole 52 is formed by an etching process, wherein a corresponding structure after implementation of this step is shown as FIG. 4.

Figure 5:
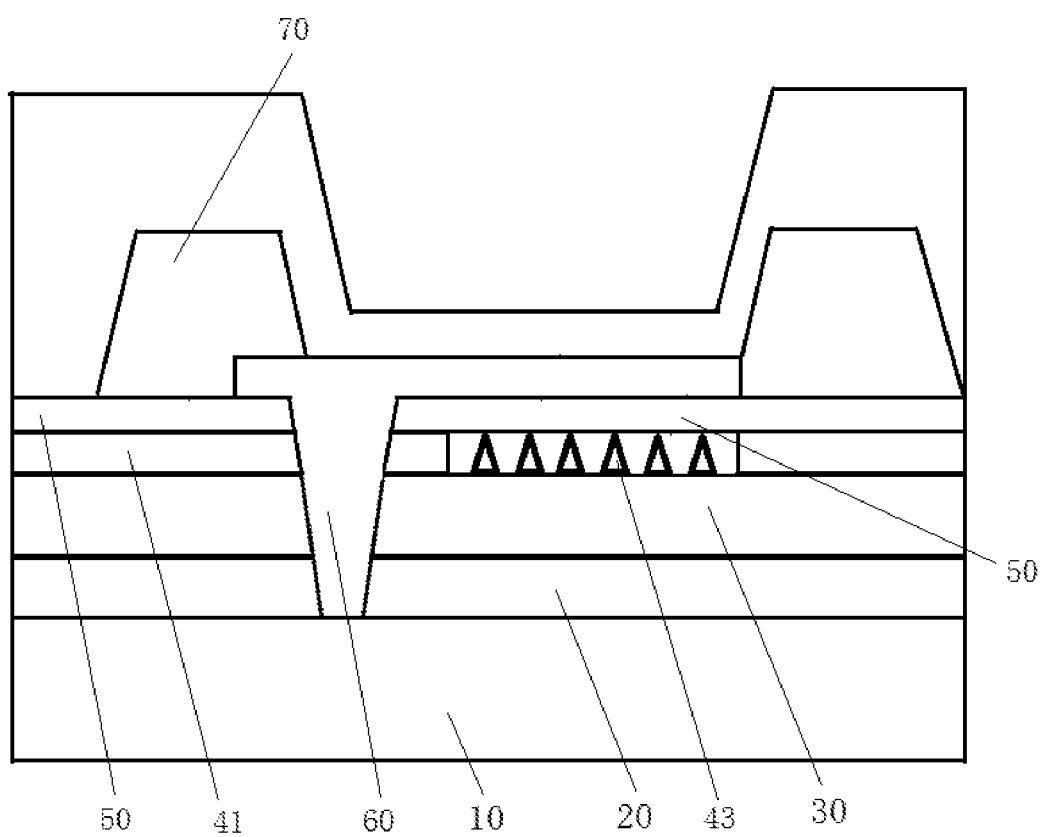
FIG. 5 is a schematic structural view showing a display panel manufactured by step S5 of the method of manufacturing the display panel of claim 1.

Step S5: form the OLED device layer on the SiNx layer. Specifically, an anode 60 and a pixel definition layer (PDL) 70 are fabricated on the SiNx layer, and finally, an OLED light-emitting device is fabricated by an evaporation process, wherein a corresponding structure after implementation of this step is shown as FIG. 5. The second SiOx film portions 43 are corresponding to a location of a light-emitting area of the OLED light-emitting device. Therefore, a photonic crystal structure is formed by corresponding portions of the SiNx layer disposed above the second SiOx film portions 43 and the fuzz surface, thereby to effectively improve a light extraction rate of the OLED device.

Furthermore, based on the method of manufacturing the display panel of the present invention, the mask used in forming the fuzz surface of the SiOx layer is also used to form the pixel definition layer of the OLED device in the subsequent step, and thus no specific and special mask is additionally required, thereby reducing costs of manufacturing the display panel of the present invention to a certain degree.

Although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A method of manufacturing a display panel, comprising:
   step S1: providing a thin-film transistor (TFT) array substrate and forming a passivation layer and an organic planarization layer on the TFT array substrate;
   step S2: forming a silicon oxide (SiOx) layer on the organic planarization layer, and patterning, by a mask, the SiOx layer, to enable the SiOx layer to form first SiOx film portions disposed in a consecutive arrangement and empty portions;
   step S3: bombarding, by using plasma, the first SiOx film portions so that part of a SiOx material in the first SiOx film portions is transferred to the empty portions to form second SiOx film portions disposed in a non-consecutive arrangement, and etching, using the second SiOx film portions as a hard mask, the organic planarization layer, wherein the second SiOx film portions after being etched form a fuzz surface;

step S4: forming a silicon nitride (SiNx) layer on the SiOx layer, wherein a photonic crystal structure is formed by corresponding portions of the SiNx layer disposed above the second SiOx film portions and the fuzz surface; and step S5: forming an organic light-emitting diode (OLED) device layer on the SiNx layer.

2. The method of manufacturing the display panel of claim 1, wherein in step S2, the empty portions formed after the SiOx layer is patterned are disposed corresponding to a light-emitting area of the OLED device layer.

3. The method of manufacturing the display panel of claim 1, wherein in step S3, the plasma includes argon (Ar) plasma, and an oxygen (O2) etching gas is used for etching of the organic planarization layer.

4. A method of manufacturing a display panel, comprising:

step S1: providing a thin-film transistor (TFT) array substrate and forming a passivation layer and an organic planarization layer on the TFT array substrate;

step S2: forming a silicon oxide (SiOx) layer on the organic planarization layer, and patterning, by a mask, the SiOx layer, to enable the SiOx layer to form first SiOx film portions disposed in a consecutive arrangement and empty portions;

step S3: bombarding, by using plasma, the first SiOx film portions so that part of a SiOx material in the first SiOx film portions is transferred to the empty portions to form second SiOx film portions disposed in a non-consecutive arrangement, and etching the organic planarization layer, wherein the second SiOx film portions after being etched form a fuzz surface;

step S4: forming a silicon nitride (SiNx) layer on the SiOx layer, wherein a photonic crystal structure is formed by corresponding portions of the SiNx layer disposed above the second SiOx film portions and the fuzz surface, and a mask used in forming the SiNx layer is the same as a mask used in forming the passivation layer in step S1; and step S5: forming an organic light-emitting diode (OLED) device layer on the SiNx layer.

5. The method of manufacturing the display panel of claim 4, wherein in step S2, the empty portions formed after the SiOx layer is patterned are disposed corresponding to a light-emitting area of the OLED device layer.

6. The method of manufacturing the display panel of claim 4, wherein in step S3, the plasma includes argon (Ar) plasma, and an oxygen (O2) etching gas is used for etching of the organic planarization layer.

7. A method of manufacturing a display panel, comprising:

step S1: providing a thin-film transistor (TFT) array substrate and forming a passivation layer and an organic planarization layer on the TFT array substrate;

step S2: forming a silicon oxide (SiOx) layer on the organic planarization layer, and patterning, by a mask, the SiOx layer, to enable the SiOx layer to form first SiOx film portions disposed in a consecutive arrangement and empty portions;

step S3: bombarding, by using plasma, the first SiOx film portions so that part of a SiOx material in the first SiOx film portions is transferred to the empty portions to form second SiOx film portions disposed in a non-consecutive arrangement, and etching the organic planarization layer, wherein the second SiOx film portions after being etched form a fuzz surface;

step S4: forming a silicon nitride (SiNx) layer on the SiOx layer, wherein a photonic crystal structure is formed by corresponding portions of the SiNx layer disposed above the second SiOx film portions and the fuzz surface; and step S5: forming an organic light-emitting diode (OLED) device layer on the SiNx layer, wherein the OLED device layer comprises a pixel definition layer, and a mask used in forming the pixel definition layer is the same as the mask used in patterning the SiOx layer in step S2.

8. The method of manufacturing the display panel of claim 7, wherein in step S2, the empty portions formed after the SiOx layer is patterned are disposed corresponding to a light-emitting area of the OLED device layer.

9. The method of manufacturing the display panel of claim 7, wherein in step S3, the plasma includes argon (Ar) plasma, and an oxygen (O2) etching gas is used for etching of the organic planarization layer.

* * * * *